(12) United States Patent
Kim et al.

(10) Patent No.: US 10,720,536 B2
(45) Date of Patent: Jul. 21, 2020

(54) SOLAR CELL MODULE

(71) Applicant: LG ELECTRONICS INC., Seoul (KR)

(72) Inventors: Minpyo Kim, Seoul (KR); Yikhyun Jeon, Seoul (KR); Taeyoon Kim, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 436 days.

(21) Appl. No.: 15/254,719

(22) Filed: Sep. 1, 2016

(65) Prior Publication Data

US 2017/0069767 A1    Mar. 9, 2017

(30) Foreign Application Priority Data

Sep. 3, 2015  (KR) .................. 10-2015-0124597

(51) Int. Cl.
*H01L 31/0216* (2014.01)
*H01L 31/049* (2014.01)

(52) U.S. Cl.
CPC ...... *H01L 31/02168* (2013.01); *H01L 31/049* (2014.12); *Y02E 10/50* (2013.01)

(58) Field of Classification Search
CPC ............. H01L 31/049; H01L 31/02168; H01L 31/0504
See application file for complete search history.

(56) References Cited

U.S. PATENT DOCUMENTS

| 5,279,680 A | 1/1994 | Chehab et al. |
| 2008/0185035 A1 | 8/2008 | Hayes |
| 2008/0216887 A1* | 9/2008 | Hacke ............. H01L 31/022441 136/244 |
| 2009/0151773 A1 | 6/2009 | Hayes et al. |
| 2009/0242020 A1 | 10/2009 | Myong |
| 2009/0260675 A1 | 10/2009 | Erdemli et al. |
| 2010/0175742 A1 | 7/2010 | Burchill et al. |
| 2011/0043901 A1 | 2/2011 | Watanabe et al. |

(Continued)

FOREIGN PATENT DOCUMENTS

| CN | 101681946 A | 3/2010 |
| CN | 103038896 A | 4/2013 |

(Continued)

OTHER PUBLICATIONS

English translation of JP 2009246208 A—provided by the EPO website. (Year: 2019).*

*Primary Examiner* — Daniel P Malley, Jr.
(74) *Attorney, Agent, or Firm* — Birch, Stewart, Kolasch & Birch, LLP

(57) ABSTRACT

A solar cell module is disclosed. The solar cell module includes a plurality of solar cells receiving light from the outside and producing electricity, a conductive line connected to an adjacent pair of the plurality of solar cells and electrically connecting the adjacent pair of the plurality of solar cells to one another, a front transparent substrate disposed on front surfaces of the plurality of solar cells and on the conductive line and transmitting light, and a back sheet disposed on back surfaces of the plurality of solar cells and on the conductive line. The back sheet has the same based color as a color of the conductive line when viewed from a front of the solar cell module.

7 Claims, 10 Drawing Sheets

(56) References Cited

U.S. PATENT DOCUMENTS

| | | | |
|---|---|---|---|
| 2011/0073166 A1* | 3/2011 | Lee | H01L 31/022441 136/251 |
| 2011/0297207 A1* | 12/2011 | Ishihara | H01L 31/048 136/246 |
| 2012/0199176 A1 | 8/2012 | Hong et al. | |
| 2012/0291842 A1 | 11/2012 | Hatakeyama et al. | |
| 2012/0325293 A1 | 12/2012 | Nattermann et al. | |
| 2013/0081674 A1* | 4/2013 | Joe | H01L 31/022441 136/251 |
| 2013/0183789 A1 | 7/2013 | Schaarschmidt et al. | |
| 2013/0263922 A1 | 10/2013 | Jung et al. | |
| 2014/0090708 A1 | 4/2014 | Kang et al. | |
| 2014/0209153 A1 | 7/2014 | Kwon et al. | |
| 2015/0075615 A1* | 3/2015 | Ihara | H01L 31/056 136/259 |
| 2015/0207003 A1 | 7/2015 | Woo et al. | |
| 2017/0133530 A1* | 5/2017 | Arai | B32B 27/08 |
| 2017/0179322 A1* | 6/2017 | Nakamura | H01L 31/042 |
| 2018/0158974 A1* | 6/2018 | Hiraki | B32B 7/02 |

FOREIGN PATENT DOCUMENTS

| | | |
|---|---|---|
| CN | 104039553 A | 9/2014 |
| JP | 1-137554 U | 9/1989 |
| JP | 6-204543 A | 7/1994 |
| JP | 2003-297122 A | 10/2003 |
| JP | 2005-243972 A | 9/2005 |
| JP | 2008-53303 A | 3/2008 |
| JP | 7-9390 Y2 | 7/2008 |
| JP | 3143376 U | 7/2008 |
| JP | 2009246208 A * | 10/2009 |
| JP | 2010-87011 A | 4/2010 |
| JP | WO2011/036802 A1 | 3/2011 |
| JP | 2011-96837 A | 5/2011 |
| JP | 2011-135011 A | 7/2011 |
| JP | 2011-142128 A | 7/2011 |
| JP | 2012-4546 A | 1/2012 |
| JP | 2012-134368 A | 7/2012 |
| JP | 2013-8983 A | 1/2013 |
| JP | WO2013/105522 A1 | 7/2013 |
| JP | 2013-237183 A | 11/2013 |
| JP | 2015-138975 A | 7/2015 |
| KR | 10-2009-0121273 A | 11/2009 |
| KR | 10-2013-0086960 A | 8/2013 |
| WO | WO 2012/111749 A1 | 8/2012 |
| WO | WO 2013/031093 A1 | 3/2013 |

* cited by examiner

SOLAR CELL MODULE

CROSS-REFERENCE TO RELATED APPLICATION

This application claims priority to and the benefit of Korean Patent Application No. 10-2015-0124597 filed in the Korean Intellectual Property Office on Sep. 3, 2015, the entire contents of which are incorporated herein by reference.

BACKGROUND OF THE INVENTION

Field of the Invention

Embodiments of the invention relate to a solar cell module.

Description of the Related Art

Recently, as existing energy sources such as petroleum and coal are expected to be depleted, interests in alternative energy sources for replacing the existing energy sources are increasing. Among the alternative energy sources, solar cells for generating electric energy from solar energy have been particularly spotlighted.

A solar cell generally includes semiconductor parts, which respectively have different conductive types, for example, a p-type and an n-type and thus form a p-n junction, and electrodes respectively connected to the semiconductor parts of the different conductive types.

A plurality of solar cells each having the above-described configuration may be connected in series or in parallel in order to obtain a desired output and may be thermally compressed between a front transparent substrate and a back sheet, thereby manufacturing a solar cell module of a panel form.

An interconnector may be formed between the plurality of solar cells in order to connect the plurality of solar cells in series or in parallel. When the interconnector is visually perceived, the interconnector may be a hindrance to a neat appearance of the solar cell module.

SUMMARY OF THE INVENTION

In one aspect, there is provided a solar cell module including a plurality of solar cells receiving light from the outside and producing electricity, a conductive line connected to an adjacent pair of the plurality of solar cells and electrically connecting the adjacent pair of the plurality of solar cells to one another, a front transparent substrate disposed on front surfaces of the plurality of solar cells and on the conductive line, the front transparent substrate transmitting the light, and a back sheet disposed on back surfaces of the plurality of solar cells and on the conductive line, wherein the back sheet has the same based color as a color of the conductive line when viewed from a front of the solar cell module.

The back sheet may include a colored thin film layer having the same based color as the color of the conductive line or a colored pigment layer including a colored pigment having the same based color as the color of the conductive line.

For example, the back sheet may include the colored thin film layer. The back sheet may further include a first sheet layer of an insulating material on a back surface of the colored thin film layer and a second sheet layer of a transparent insulating material on a front surface of the colored thin film layer.

In this instance, the insulating materials of the first and second sheet layers may include at least one of polyethylene terephthalate (PET), polyethylene (PE), polypropylene (PP), polyvinyl fluoride (PVF), and polyvinylidene difluoride (PVDF).

The first sheet layer may include a white pigment.

The colored thin film layer may be formed as a thin film layer of a metal material. The metal material of the colored thin film layer may include at least one of aluminum (Al) and silver (Ag).

Thicknesses of the first and second sheet layers may be greater than a thickness of the colored thin film layer. For example, the thicknesses of the first and second sheet layers may be 80 μm to 120 μm, and the thickness of the colored thin film layer may be 0.5 μm to 50 μm.

The back sheet may include the colored pigment layer. The colored pigment layer may include the colored pigment in at least one insulating material of polyethylene terephthalate (PET), polyethylene (PE), polypropylene (PP), polyvinyl fluoride (PVF), and polyvinylidene difluoride (PVDF).

The colored pigment may be particles having a diameter or a length of 5 μm to 50 μm. An amount of the colored pigment with respect to the at least one insulating material in the colored pigment layer may be about 10 vol % to 40 vol %.

The back sheet may further include a first sheet layer of a white insulating material on a back surface of the colored pigment layer.

The colored thin film layer or the colored pigment layer may be positioned between the plurality of solar cells when viewed from the front surface of the solar cell module.

The conductive line may include a core including at least one of copper (Cu) or aluminum (Al) and a coating layer that is coated on a surface of the core and includes tin (Sn).

The conductive line may include a first conductive line that extends in the same direction as an electrical connection direction of the plurality of solar cells and is connected to each of the plurality of solar cells.

The conductive line may include a second conductive line that is positioned between the plurality of solar cells, is spaced apart from the plurality of solar cells, extends in a direction crossing the first conductive line, and is connected to the first conductive line.

The back sheet may include a first sheet layer, a second sheet layer, and a colored thin film layer or a colored pigment layer disposed between the first sheet layer and the second sheet layer. The colored thin film layer or the colored pigment layer may be located at an area corresponding to a gap between the adjacent pair of the plurality of solar cells.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE EMBODIMENTS

Figure 1:
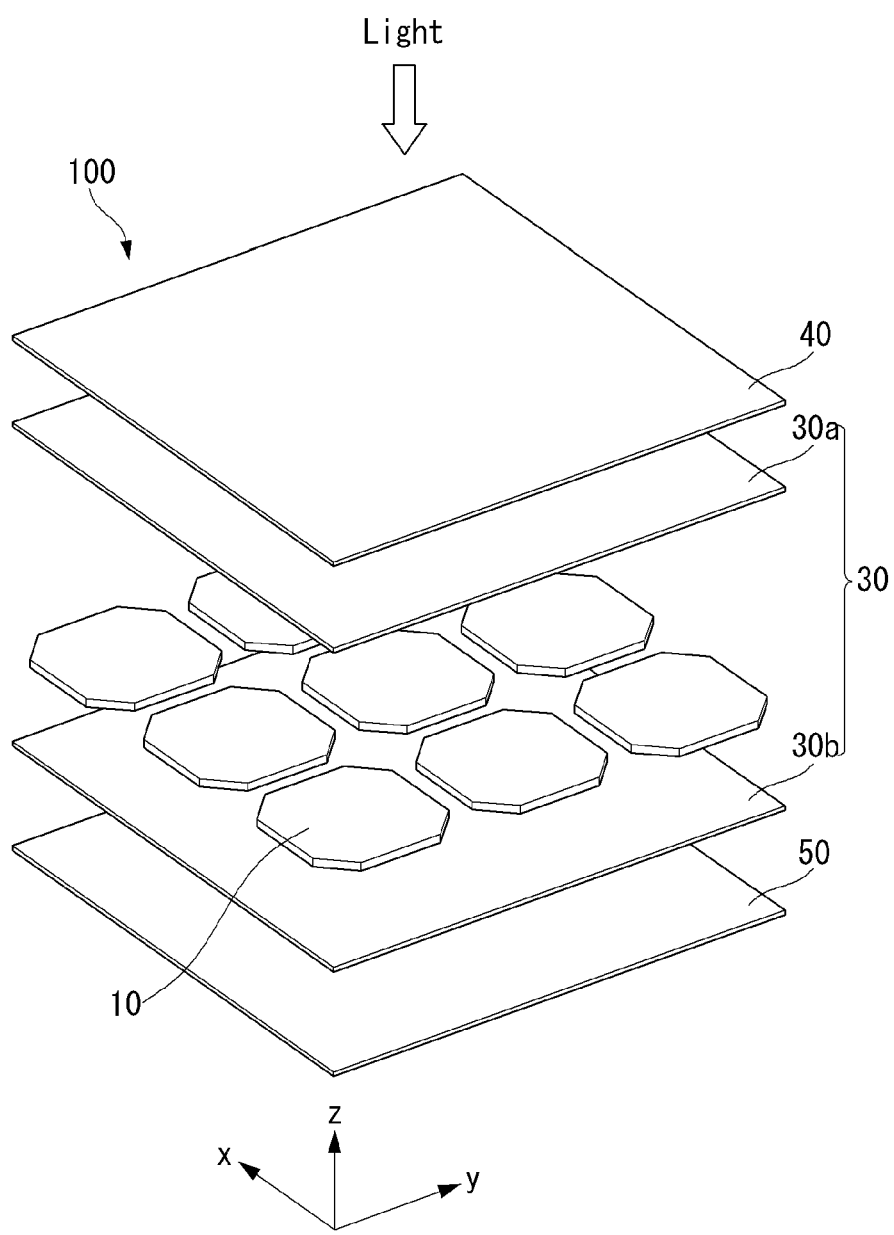
FIG. 1 is an exploded perspective view illustrating an example of a solar cell module according to an embodiment of the invention.

Reference will now be made in detail to embodiments of the invention, examples of which are illustrated in the accompanying drawings. This invention may, however, be embodied in many different forms and should not be construed as limited to the embodiments set forth herein. Wherever possible, the same reference numbers will be used throughout the drawings to refer to the same or like parts. It will be noted that a detailed description of known arts will be omitted if it is determined that the detailed description of the known arts can obscure the embodiments of the invention.

In the drawings, the thickness of layers, films, panels, regions, etc., are exaggerated for clarity. It will be understood that when an element such as a layer, film, region, or substrate is referred to as being "on" another element, it can be directly on the other element or intervening elements may also be present. In contrast, when an element is referred to as being "directly on" another element, there are no intervening elements present.

Further, it will be understood that when an element such as a layer, film, region, or substrate is referred to as being "entirely" on other element, it may be on the entire surface of the other element and may not be on a portion of an edge of the other element.

FIG. 1 is an exploded perspective view illustrating an example of a solar cell module according to an embodiment of the invention.

As shown in FIG. 1, a solar cell module 100 according to an embodiment of the invention may include a plurality of solar cells 10, a front transparent substrate 40, an encapsulant 30, and a back sheet 50.

Each of the plurality of solar cells 10 receives light incident from the outside and produces electricity.

Each solar cell 10 may include a semiconductor layer, that forms a p-n junction causing light incident from the outside to be separated into holes and electrons, and electrodes collecting carriers separated into holes and electrons.

Examples of the solar cell 10 applicable to the solar cell module 100 according to the embodiment of the invention may include a conventional solar cell, in which electrodes are disposed on each of a front surface and a back surface of a semiconductor substrate, and a back contact solar cell, in which electrodes are disposed on a back surface of a semiconductor substrate.

The plurality of solar cells 10 are disposed to be spaced apart from one another. The solar cell module 100 according to the embodiment of the invention may include a plurality of conductive lines electrically connecting the plurality of solar cells 10 in series.

The plurality of conductive lines may electrically connect the plurality of solar cells 10 to form a string, in which the plurality of solar cells 10 is electrically connected to one another. The plurality of conductive lines may be positioned between the plurality of solar cells 10 and may be a hindrance to a neat appearance of the solar cell module 100.

The front transparent substrate 40 may be disposed on front surfaces of the solar cells 10 in order to protect the solar cells 10 from an external environment and may be formed of a material capable of transmitting light. For example, the front transparent substrate 40 may be formed of a tempered glass or a transparent plastic material having a high transmittance and an excellent damage prevention function.

In this instance, the tempered glass may be a low iron tempered glass containing a small amount of iron. The front transparent substrate 40 may have an embossed inner surface in order to increase a scattering effect of light.

As shown in FIG. 1, the encapsulant 30 may include a first encapsulant 30a and a second encapsulant 30b. The first encapsulant 30a may be positioned between the solar cells 10 and the front transparent substrate 40, and the second encapsulant 30b may be positioned between the solar cells 10 and the back sheet 50.

The first and second encapsulants 30a and 30b are positioned between the front transparent substrate 40 and the solar cells 10 and between the solar cells 10 and the back sheet 50 and thus can prevent a corrosion resulting from the moisture penetration and protect the solar cells 10 from an external impact.

The encapsulant 30 may be made of any material as long as the material is transparent. For example, the encapsulant 30 may be made of an ethylene vinyl acetate (EVA) copolymer resin, a polyvinyl butyral resin, a silicon resin, an ester-based resin, an olefin-based resin, and the like.

The back sheet 50 can prevent moisture and oxygen from penetrating into back surfaces of the solar cells 10 and protect the solar cells 10 from an external environment. The back sheet 50 may have a multi-layered structure including a moisture/oxygen penetrating prevention layer, a chemical corrosion prevention layer, etc.

The front transparent substrate 40, the first encapsulant 30a, the solar cells 10, the second encapsulant 30b, and the back sheet 50 may be integrated through a lamination process involving a thermal compression process to form the solar cell module 100.

When viewed from the front surface (or the front) of the solar cell module 100, the above-described conductive lines and the back sheet 50 may be seen between the plurality of solar cells, that are spaced apart from one another.

In this instance, in the embodiment of the invention, the back sheet 50 seen between the solar cells 10 may have the same color as the conductive lines, so that the appearance of the solar cell module 100 is neater or more beautiful or appealing.

Thus, the solar cell module 100 according to the embodiment of the invention may look as if the plurality of conductive lines is not positioned between the plurality of solar cells.

After a connection structure of the conductive lines electrically connecting the plurality of solar cells is described, a structure of the solar cell module 100, in which the back sheet 50 has the same color as the conductive lines, is described.

FIGS. 2 to 5 illustrate various examples of a string applicable to a solar cell module according to an embodiment of the invention.

Figure 2:
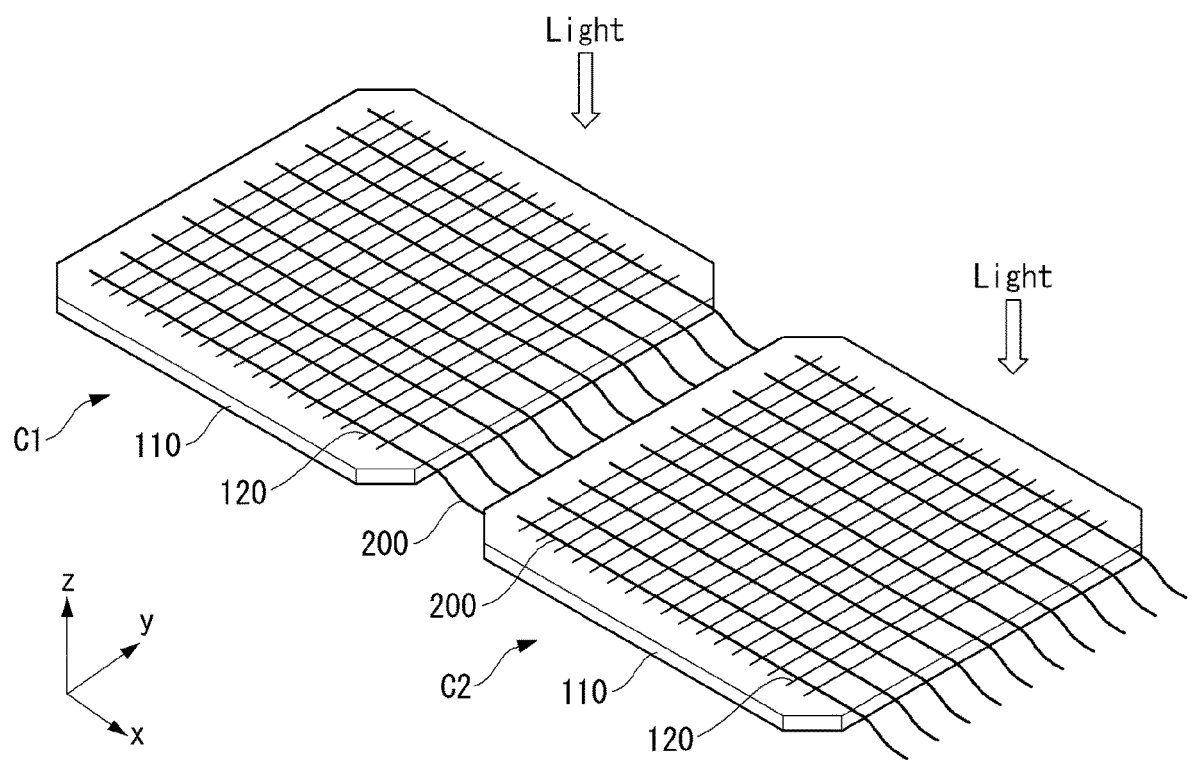
FIGS. 2 to 5 illustrate various examples of a string applicable to a solar cell module according to an embodiment of the invention.

More specifically, FIG. 2 is a perspective view illustrating a first example of a string applicable to the solar cell module 100 according to the embodiment of the invention.

Each solar cell according to the first example may be a conventional solar cell, in which electrodes 120 are disposed on each of a front surface and a back surface of a semiconductor substrate 110.

More specifically, each of first and second solar cells C1 and C2 may include the semiconductor substrate 110 forming a p-n junction.

For example, an emitter region of a first conductive type may be positioned at one of the front surface and the back surface of the semiconductor substrate 110, and a back surface field region of a second conductive type opposite the first conductive type may be positioned at the other surface of the semiconductor substrate 11

The electrodes 120 respectively connected to the emitter region and the back surface field region may be disposed on each of the front surface and the back surface of the semiconductor substrate 110.

A plurality of conductive lines 200 may extend in the same direction as an electrical connection direction of the plurality of solar cells and may be connected to each of the plurality of solar cells.

More specifically, the plurality of conductive lines 200 may be connected to first conductive electrodes 120 connected to the emitter region positioned at a front surface of the first solar cell C1 and second conductive electrodes 120 connected to the back surface field region positioned at a back surface of the second solar cell C2 through a conductive adhesive, thereby connecting the first and second solar cells C1 and C2 in series.

Each conductive line 200 may have a conductive wire shape, in which a thickness and a width are the same as each other. About 6 to 33 conductive lines 200 may be used in the first example.

Each conductive line 200 may include a core including at least one of copper (Cu) or aluminum (Al) and a coating layer that is coated on a surface of the core and includes tin (Sn).

Figure 3:
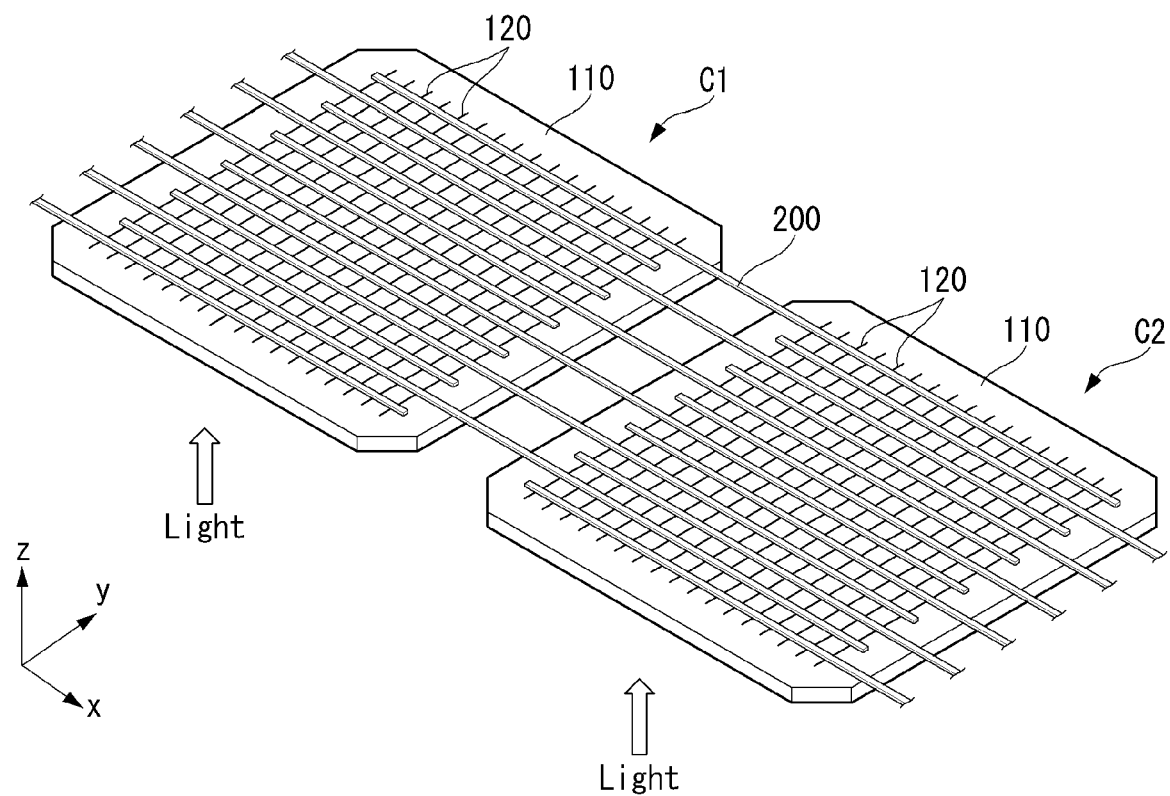

FIG. 3 is a perspective view illustrating a second example of a string applicable to the solar cell module 100 according to the embodiment of the invention. More specifically, FIG. 3 shows that a back surface of a solar cell upwardly faces.

Each solar cell according to the second example may be a back contact solar cell, in which electrodes 120 are disposed only on a back surface of a semiconductor substrate 110.

More specifically, each of first and second solar cells C1 and C2 may include an emitter region of a first conductive type and a back surface field region of a second conductive type positioned at the back surface of the semiconductor substrate 110.

The electrodes 120 respectively connected to the emitter region and the back surface field region may be disposed only on the back surface of the semiconductor substrate 100.

A plurality of conductive lines 200 according to the second example may extend in the same direction as an electrical connection direction of the plurality of solar cells and may be connected to each of the plurality of solar cells, in the same manner as the plurality of conductive lines 200 according to the first example.

However, the second example is different from the first example in a position of the electrode 120 included in the solar cell. Namely, the plurality of conductive lines 200 according to the second example may be connected only to the back surface of each solar cell, unlike the plurality of conductive lines 200 according to the first example.

More specifically, the plurality of conductive lines 200 may be connected to first conductive electrodes 120 positioned on a back surface of the first solar cell C1 and second conductive electrodes 120 positioned on a back surface of the second solar cell C2, thereby connecting the first and second solar cells C1 and C2 in series.

A length of the conductive line 200 connecting the first and second solar cells C1 and C2 in series may be greater than a sum of lengths of the semiconductor substrates 110 included in the first and second solar cells C1 and C2.

The conductive line 200 may be connected to the electrodes 120 of each solar cell through a conductive adhesive and may have a ribbon shape, in which a width is greater than a thickness. About 6 to 33 conductive lines 200 may be used in the second example.

Each conductive line 200 may include a core and a coating layer in the same manner as the conductive line 200 according to the first example.

Figure 4:
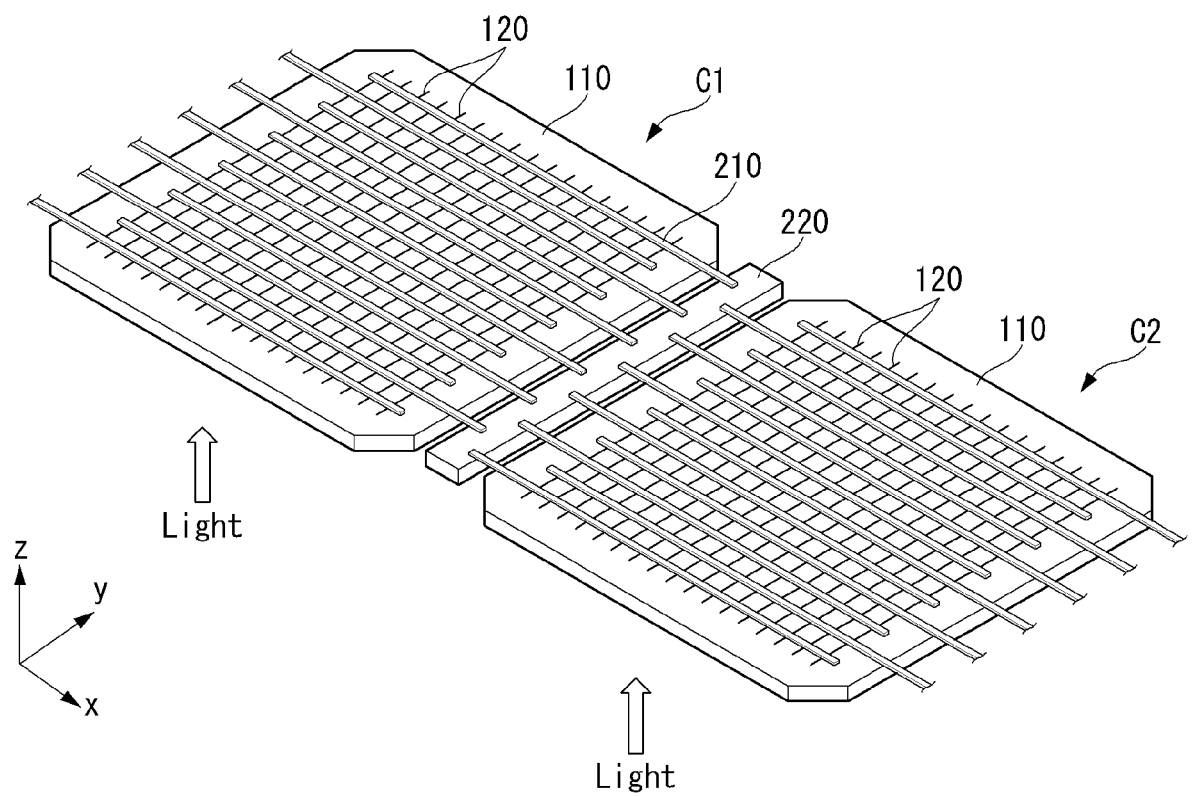

FIG. 4 is a perspective view illustrating a third example of a string applicable to the solar cell module 100 according to the embodiment of the invention. More specifically, FIG. 4 shows that a back surface of a solar cell upwardly faces.

As shown in FIG. 4, each solar cell according to the third example may be a back contact solar cell, in which electrodes 120 are disposed only on a back surface of a semiconductor substrate 110, in the same manner as the second example.

A plurality of conductive lines 200 according to the third example may extend in the same direction as an electrical connection direction of the plurality of solar cells. Unlike the second example, the conductive lines 200 according to the third example may include not only first conductive lines 210 connected to each solar cell but also a second conductive line 220 that is disposed between the solar cells, is spaced apart from the solar cells, and extends in a direction crossing the first conductive lines 210. The first conductive lines 210 may be connected to the second conductive line 220.

A length of the first conductive line 210 according to the third example may be shorter than the length of the conductive line 200 according to the second example. The first conductive lines 210 may be spaced apart from one another and may be connected to first conductive electrodes 120 of a first solar cell C1 and second conductive electrodes 120 of a second solar cell C2.

The first conductive lines 210 connected to the first solar cell C1 and the first conductive lines 210 connected to the second solar cell C2 may be commonly connected to the second conductive line 220.

Each of the first and second conductive lines 210 and 220 may include a core and a coating layer in the same manner as the first example.

When viewed from the front surface of the solar cell module 100, the above-described conductive lines 200 may be positioned between the solar cells. The conductive lines 200 seen between the solar cells may be a hindrance to the neat appearance of the solar cell module 100.

However, in the solar cell module 100 according to the embodiment of the invention, because the back sheet 50 has the same based color (or the same color) as a color of the conductive lines 200 electrically connecting the plurality of solar cells, the appearance of the solar cell module 100 can be neater.

Figure 5:
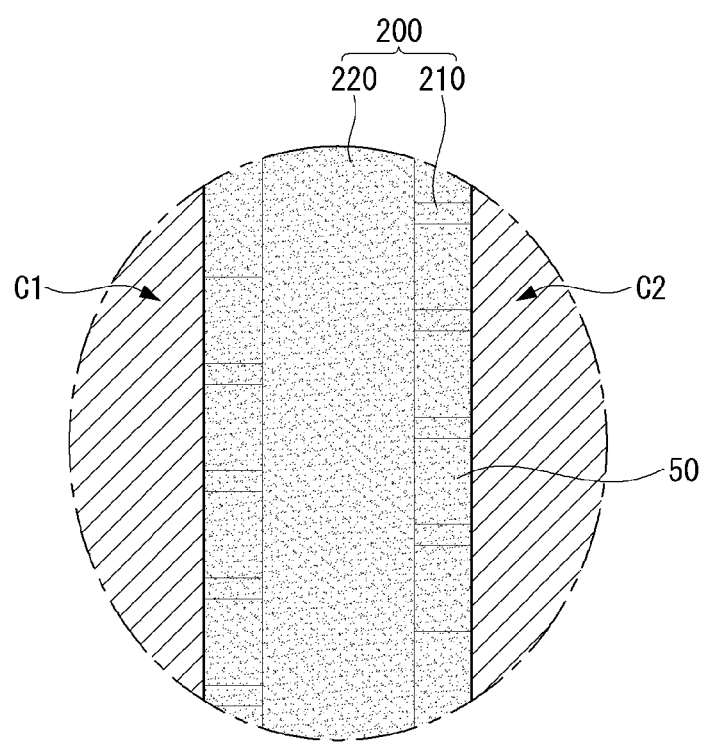

For example, as shown in FIG. 5, the embodiment of the invention may cause the back sheet 50 to have the same based color as the color of the conductive lines 200 when viewed from the front surface of the solar cell module 100.

Hence, when viewed from the front surface of the solar cell module 100 according to the embodiment of the invention, it is not easy to make a visual distinction between the conductive lines 200 and the back sheet 50 positioned between the solar cells.

As a result, the neat appearance of the solar cell module 100 according to the embodiment of the invention can be implemented as if there is no conductive line 200 between the solar cells.

To this end, the back sheet 50 may include a colored thin film layer having the same based color as the color of the conductive line 200 or a colored pigment layer, to which a colored pigment having the same based color as the color of the conductive line 200 is added.

For example, when the coating layer of the conductive line 200 has a silver color, the back sheet 50 may include a colored thin film layer or a colored pigment layer that makes the back sheet 50 be seen as a silver-based color.

The back sheet 50 according to the embodiment of the invention is described in detail below.

FIGS. 6 to 9 illustrate various examples of the back sheet 50 in a cross section of the solar cell module 100 according to the embodiment of the invention.

FIGS. 6 to 9 illustrate the solar cell string of FIG. 4 among the solar cell strings illustrated in FIGS. 2 to 4, as an example. However, the solar cell strings of FIGS. 2 and 3 may be used in FIGS. 6 to 9.

In FIGS. 6 to 9, reference numerals 50A, 50B, 50C, and 50D denote various examples of the back sheet 50 according to the embodiment of the invention.

Figure 6:
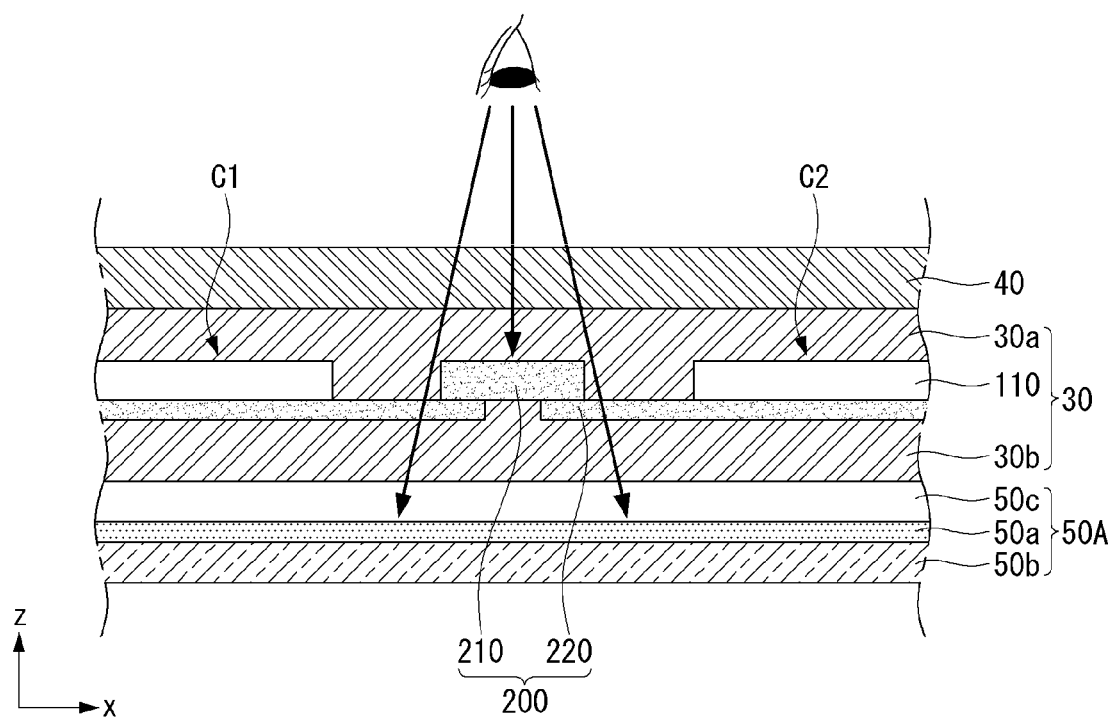
FIGS. 6 to 9 illustrate various examples of a back sheet in a cross section of a solar cell module according to an embodiment of the invention.

As shown in FIG. 6, a back sheet 50A applicable to the solar cell module 100 according to the embodiment of the invention may include a colored thin film layer 50a, a first sheet layer 50b, and a second sheet layer 50c.

The colored thin film layer 50a, the first sheet layer 50b, and the second sheet layer 50c may be formed on the entire back sheet 50A in a layered structure.

The first sheet layer 50b may include an opaque insulating material and may be positioned on a back surface of the colored thin film layer 50a, i.e., an outermost side of the back sheet 50A. The second sheet layer 50c may include a transparent insulating material and may be positioned on a front surface of the colored thin film layer 50a, i.e., a first front surface of the back sheet 50A. Hence, the second sheet layer 50c may directly adjoin the encapsulant 30.

Thus, the colored thin film layer 50a may be positioned between the first and second sheet layers 50b and 50c, and the second sheet layer 50c may be transparent. Therefore, when viewed from the front surface of the solar cell module 100, the colored thin film layer 50a may be visually seen.

The insulating material of the first and second sheet layers 50b and 50c may include at least one of polyethylene terephthalate (PET), polyethylene (PE), polypropylene (PP), polyvinyl fluoride (PVF), or polyvinylidene difluoride (PVDF).

The first sheet layer 50b may further include a white pigment, for example, titanium dioxide ($TiO_2$) in addition to the above-described insulating material, in order to improve a reflectance of the back sheet 50A.

In the embodiment disclosed herein, the colored thin film layer 50a may be formed as a thin film layer of a metal material. For example, the metal material of the colored thin film layer 50a may be at least one of aluminum (Al) or silver (Ag) having the same based color (for example, a silver color) as the color of the conductive line 200.

The conductive line 200 of the silver color was described and illustrated above as an example. However, when the conductive line 200 has colors other than the silver color, the colored thin film layer 50a may include any material and may include materials other than a metal material as long as the material has the same based color as the color of the conductive line 200.

Thicknesses of the first and second sheet layers 50b and 50c may be greater than a thickness of the colored thin film layer 50a. For example, the thicknesses of the first and second sheet layers 50b and 50c may be 80 μm to 120 μm, and the thickness of the colored thin film layer 50a may be 0.5 μm to 50 μm.

The thickness of the first sheet layer 50b may be set to 80 μm to 120 μm in consideration of the manufacturing cost and a moisture proofing function of the first sheet layer 50b. The thickness of the second sheet layer 50c may be set to 80 μm to 120 μm in consideration of the manufacturing cost, an insulating function, and a moisture proofing function of the second sheet layer 50c.

When the thickness of the colored thin film layer 50a is equal to or greater than 0.5 μm, the color of the colored thin film layer 50a can be sufficiently seen when viewed from the front surface of the solar cell module 100. When the thickness of the colored thin film layer 50a is equal to or less than 50 μm, the manufacturing cost of the colored thin film layer 50a can be minimized while the colored thin film layer 50a is sufficiently seen.

When the colored thin film layer 50a is formed of a metal material, for example, aluminum, the colored thin film layer 50a may be formed of an aluminum foil or may be formed by depositing aluminum on the first sheet layer 50b or the second sheet layer 50c using a sputtering method.

When the colored thin film layer 50a is formed of the aluminum foil, the colored thin film layer 50a may have a thickness of 35 μm. When the colored thin film layer 50a is formed using the sputtering method, the colored thin film layer 50a may have a thickness of 0.5 μm to 1 μm.

As described above, when the back sheet 50A includes the colored thin film layer 50a, it is difficult to clearly make a visual distinction between the conductive lines 200 and the back sheet 50A when viewed from the front surface of the solar cell module 100. Therefore, the appearance of the solar cell module 100 can be neater or more beautiful or appealing.

As shown in FIG. 6, the back sheet 50A may be configured to include the colored thin film layer 50a. Unlike this, the back sheet 50A may be configured to include a colored pigment layer, to which a colored pigment having the same based color as the color of the conductive line 200 is added.

Figure 7:
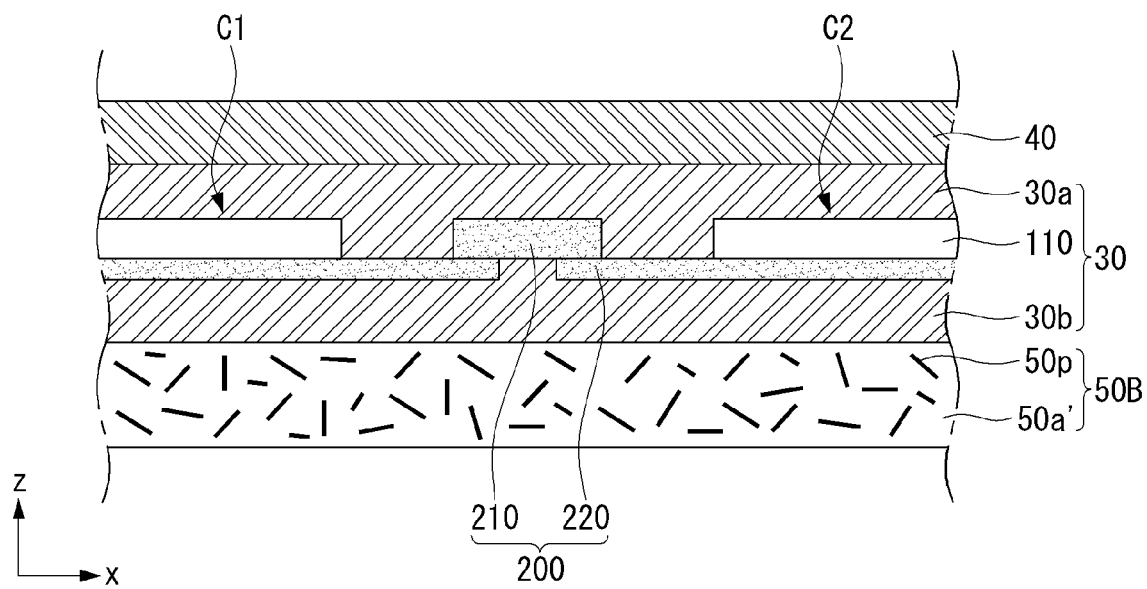

For example, as shown in FIG. 7, a back sheet 50B may be entirely formed as a colored pigment layer 50a', to which a colored pigment 50p having the same based color as the conductive line 200 is added.

When the back sheet 50B is entirely formed as the colored pigment layer 50a', the colored pigment layer 50a' may be formed by adding the colored pigment 50p to at least one insulating material of polyethylene terephthalate (PET), polyethylene (PE), polypropylene (PP), polyvinyl fluoride (PVF), or polyvinylidene difluoride (PVDF).

The colored pigment 50p may be particles having a diameter or a length of 5 μm to 50 μm. In this instance, the colored pigment 50p may have the same based color as the color of the conductive line 200. For example, the colored pigment 50p may have a pearl silver color.

An amount of the colored pigment 50p with respect to the at least one insulating material in the colored pigment layer 50a' may be about 10 vol % to 40 vol %.

When the amount of the colored pigment 50p is equal to or greater than about 10 vol %, the colored pigment layer 50a' may sufficiently have (or represent) its color. When the amount of the colored pigment 50p exceeds about 40 vol %, it is difficult to manufacture the colored pigment layer 50a'.

Figure 8:
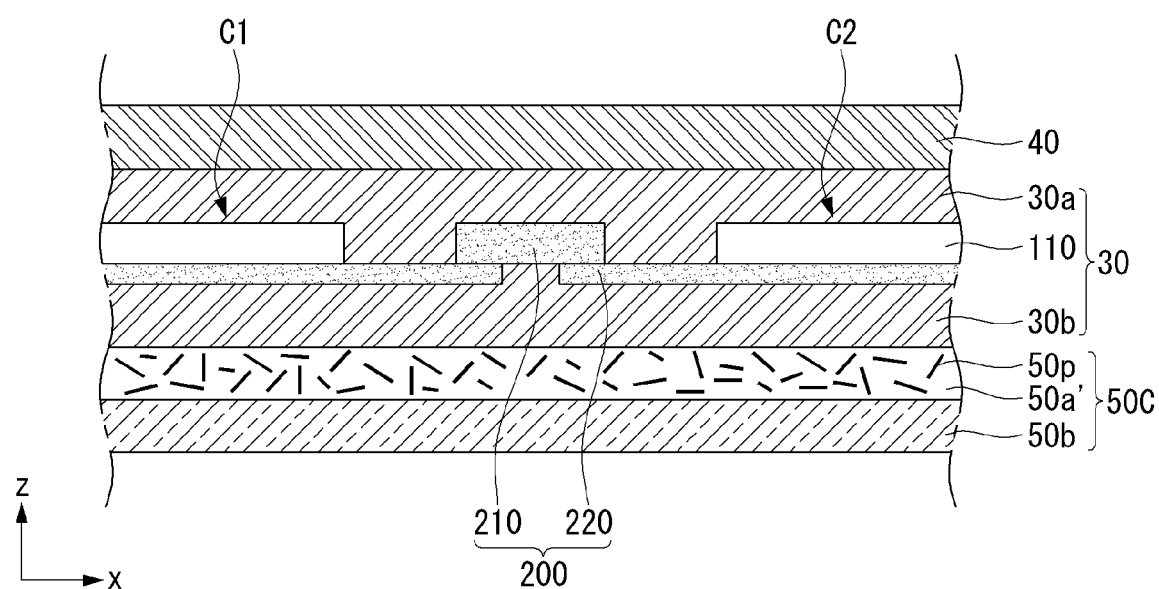

FIG. 7 illustrates the back sheet 50B is entirely formed as the colored pigment layer 50a' as an example. Unlike this, as shown in FIG. 8, a back sheet 50C may further include a first sheet layer 50b formed of a white insulating material of the above-described colored pigment layer 50a'. The first sheet layer 50b of FIG. 8 may use the same material as the first sheet layer 50b illustrated in FIG. 6.

Figure 9:
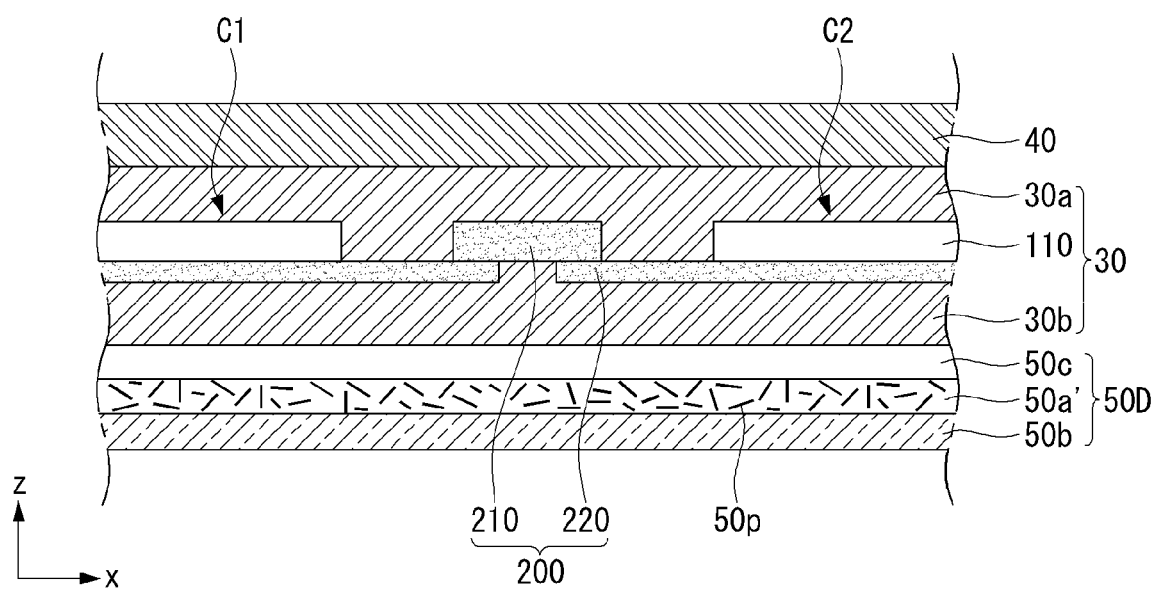

Further, as shown in FIG. 9, a back sheet 50D may include a colored pigment layer 50a', a first sheet layer 50b, and a second sheet layer 50c. The second sheet layer 50c of FIG. 9 may use the same material as the second sheet layer 50c illustrated in FIG. 6.

FIGS. 6 to 9 illustrate that (1) the back sheet 50 includes another colored thin film layer 50a or another colored pigment layer 50a' that is entirely formed in the layered structure, or (2) the back sheet 50 is entirely formed as the colored pigment layer 50a', as an example.

However, the colored thin film layer 50a or the colored pigment layer 50a' of the back sheet 50 is not formed throughout the entire area of the back sheet 50 and may be formed in a partial area of the back sheet 50 exposed through a separation space between the plurality of solar cells.

This is described in detail below with reference to FIGS. 10 and 11.

Figure 10:
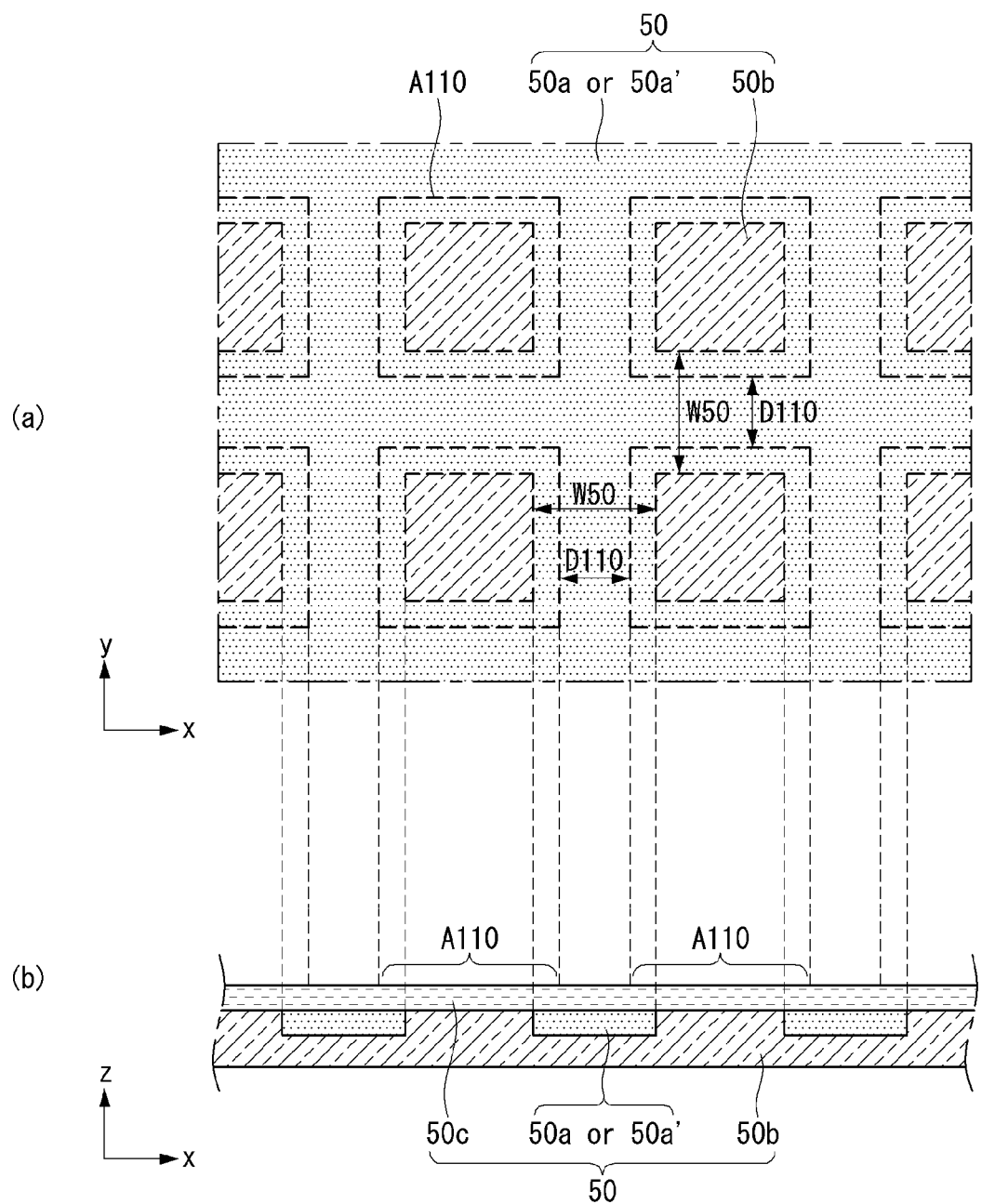
FIG. 10 illustrates a formation area of a colored thin film layer or a colored pigment layer in a back sheet according to another embodiment of the invention.

FIG. 10 illustrates a formation area of a colored thin film layer or a colored pigment layer in a back sheet according to another embodiment of the invention. FIG. 11 illustrates a cross section of a solar cell module, to which a back sheet according to another embodiment of the invention is applied.

More specifically, (a) of FIG. 10 is a plan view of a portion of a back sheet 50, and (b) of FIG. 10 is a cross-sectional view of (a) of FIG. 10. In FIG. 10, "A110" indicates an area overlapping the solar cell.

As shown in (a) and (b) of FIG. 10, a back sheet 50 according to another embodiment of the invention may include a colored thin film layer 50a or a colored pigment layer 50a', a first sheet layer 50b, and a second sheet layer 50c.

In FIG. 10, the first sheet layer 50b may be white, and the second sheet layer 50c may be transparent. Thus, when viewed from the front of the back sheet 50, the white first sheet layer 50b may be seen in the area A110 of the back sheet 50 overlapping the solar cell, and the colored thin film layer 50a or the colored pigment layer 50a' may be seen in an area between the solar cells.

More specifically, as shown in (a) of FIG. 10, the colored thin film layer 50a or the colored pigment layer 50a' may be formed not in the entire area of the back sheet 50 but only in a predetermined area of the back sheet 50 while being positioned between the first and second sheet layers 50b and 50c as shown in (b) of FIG. 10.

Further, the colored thin film layer 50a or the colored pigment layer 50a' may be positioned between the formation areas A110 of the plurality of solar cells in the entire area of the back sheet 50 and may partially overlap the formation area of the solar cell in consideration of a process margin.

Hence, a width W50 of a formation area of the colored thin film layer 50a or the colored pigment layer 50a' between the solar cells may be greater than a distance D110 between the solar cells.

Figure 11:
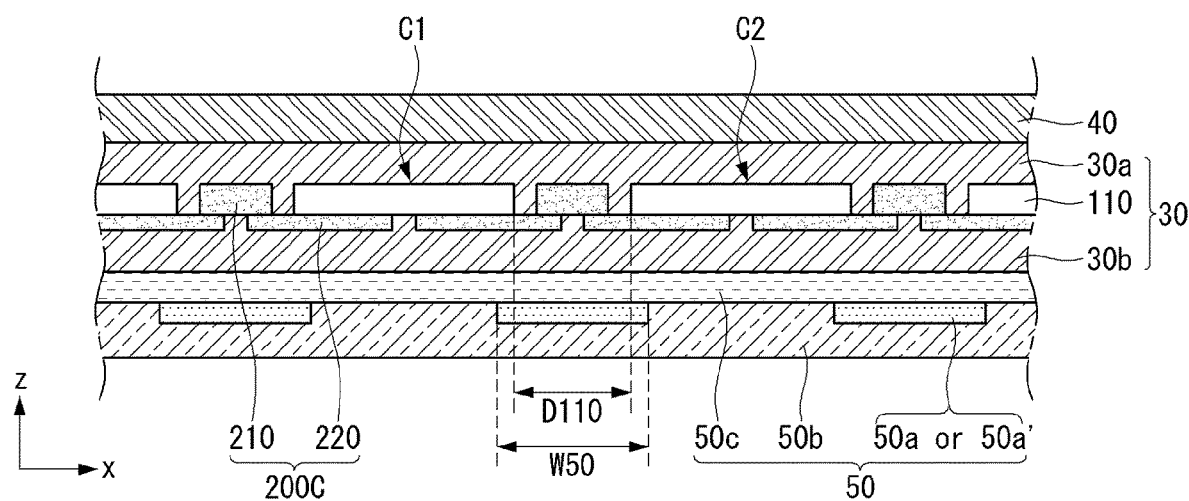
FIG. 11 illustrates a cross section of a solar cell module, to which a back sheet according to another embodiment of the invention is applied.

Thus, when the back sheet 50 of FIG. 10 is applied to the solar cell module 100, the colored thin film layer 50a or the colored pigment layer 50a' may be positioned between the solar cells as shown in FIG. 11 when viewed from the front surface of the solar cell module 100.

As described above, the solar cell module 100 according to the embodiment of the invention is configured such that the colored thin film layer 50a or the colored pigment layer 50a' of the back sheet 50 is positioned between the solar cells and the white first sheet layer 50b of the back sheet 50 is exposed to the back surface of the solar cell.

Hence, the neater appearance of the solar cell module 100 can be implemented while reducing the manufacturing cost of the colored thin film layer 50a or the colored pigment layer 50a'. Furthermore, because light, that is transmitted by the solar cell and then reflected, can be again incident on the solar cell by exposing the white first sheet layer 50b to the back surface of the solar cell, the efficiency of the solar cell module 100 can be further improved.

In the solar cell module 100 according to the embodiment of the invention, the back sheet 50 includes the colored thin film layer 50a or the colored pigment layer 50a' having the same based color as the color of the conductive line 200, and thus the neater appearance of the solar cell module 100 can be implemented.

So far, the embodiment of the invention described the first to third examples illustrated in FIGS. 2 to 4 as an example of the string applicable to the solar cell module 100, but is not limited thereto. Any interconnector or any conductive line may be applied to the embodiment of the invention as long as they electrically connect the solar cells and are exposed between the solar cells.

For example, when an interconnector of a clip structure is positioned between two adjacent solar cells, both ends of the interconnector overlap the two adjacent solar cells, one end of the interconnector is connected to first electrodes of one of the two adjacent solar cells using a conductive adhesive, such as a solder, and the other end of the interconnector is connected to second electrodes of the other solar cell using the conductive adhesive, the interconnector of the clip structure may be applied to the embodiment of the invention.

Namely, when the embodiment of the invention includes the interconnector of the clip structure, the back sheet 50 may have the same based color as a color of the interconnector of the clip structure.

In the embodiment of the invention, FIGS. 6 to 9 and FIG. 11 illustrate that the second encapsulant 30b is positioned between the conductive lines 200 and the back sheet 50, as an example. However, the second encapsulant 30b may be omitted in the embodiment of the invention.

When the second encapsulant 30b is omitted, two adjacent solar cells may be electrically connected in a state where the conductive lines are patterned on the back sheet. In this instance, the back sheet may have the same based color as a color of the patterned conductive lines. Further, the back sheet, on which the conductive lines are patterned, may have the same shape as an insulating substrate.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A solar cell module comprising:
a plurality of solar cells spaced apart from each other in a first direction, each of the plurality of solar cells having first electrodes and second electrodes;
a plurality of first conductive lines connected to an adjacent pair of the plurality of solar cells and electrically connecting the adjacent pair of the plurality of solar cells to one another;
a front transparent substrate disposed on front surfaces of the plurality of solar cells and on the plurality of first conductive lines, the front transparent substrate transmitting light; and
a back sheet disposed on back surfaces of the plurality of solar cells, wherein the back sheet includes:
  a first layer including white pigment and disposed as an outmost layer;
  a transparent second layer disposed more adjacent to the plurality of solar cells than the first layer; and
  a colored layer between the first layer and the transparent second layer,
wherein the colored layer is selectively formed at an area corresponding to a gap between the adjacent pair of the plurality of solar cells,
wherein the first layer is seen in an area of the back sheet overlapping the plurality of solar cells, and the colored layer is seen in an area between the plurality of solar cells, wherein the first layer contact both the colored layer and the transparent second layer, wherein the first layer is thinner where the colored layer is in contact with the first layer than where the transparent second layer is in contact with the first layer and
wherein the first layer is exposed to the back surfaces of the plurality of solar cells.

2. The solar cell module of claim 1, wherein the colored layer comprises a colored pigment in at least one insulating material of polyethylene terephthalate (PET), polyethylene (PE), polypropylene (PP), polyvinyl fluoride (PVF), and polyvinylidene difluoride (PVDF).

3. The solar cell module of claim 2, wherein the colored pigment is particles having a diameter or a length of 5 μm to 50 μm.

4. The solar cell module of claim 2, wherein an amount of the colored pigment with respect to the at least one insulating material in the colored pigment layer is about 10 vol % to 40 vol %.

5. The solar cell module of claim 1, wherein the plurality of first conductive lines include a core including at least one of copper (Cu) and aluminum (Al), and a coating layer that is coated on a surface of the core and includes tin (Sn).

6. The solar cell module of claim 1, further comprising a second conductive line that is positioned between the plurality of solar cells extends in a second direction crossing a first direction, and is connected to the plurality of first conductive lines.

7. The solar cell module of claim 2, wherein the colored layer has the same based color as a color of the plurality of first conductive lines or the colored pigment has the same based color as the color of the plurality of first conductive lines.

* * * * *